(12) United States Patent
Bhat et al.

(10) Patent No.: US 12,147,201 B2
(45) Date of Patent: Nov. 19, 2024

(54) SEGMENTED DIGITAL-TO-TIME CONVERTER

(71) Applicant: Cisco Technology, Inc., San Jose, CA (US)

(72) Inventors: Abhishek Bhat, Allentown, PA (US); Ajay Bharadwaj, Breinigsville, PA (US); Romesh Kumar Nandwana, Chapel Hill, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 55 days.

(21) Appl. No.: 17/989,045

(22) Filed: Nov. 17, 2022

(65) Prior Publication Data

US 2024/0168442 A1 May 23, 2024

(51) Int. Cl.
*H03D 3/24* (2006.01)
*G04F 10/00* (2006.01)
*H03L 7/099* (2006.01)

(52) U.S. Cl.
CPC .......... *G04F 10/005* (2013.01); *H03L 7/0992* (2013.01)

(58) Field of Classification Search
CPC ..... G04F 10/005; H03L 7/081; H03L 7/0814; H03L 7/0992; H03L 7/18; H03L 7/0991; H03L 7/1976; H03L 7/0816; H04L 7/081; H03M 1/064; H03M 1/836
USPC .......... 375/376; 327/156; 455/103, 127, 307; 331/177 R
See application file for complete search history.

(56) References Cited

U.S. PATENT DOCUMENTS

| | | | | |
|---|---|---|---|---|
| 7,439,787 B2 * | 10/2008 | Hashim | .................. | H03L 7/0816 327/172 |
| 9,356,773 B2 * | 5/2016 | Zhou | ..................... | H04L 7/0025 |
| 10,642,227 B1 | 5/2020 | Lin | | |
| 11,418,205 B1 * | 8/2022 | Schwarz | ............... | H03L 7/0992 |
| 2018/0269895 A1 | 9/2018 | Kim | | |
| 2018/0351561 A1 | 12/2018 | Zhao et al. | | |
| 2019/0115926 A1 | 4/2019 | Ximenes et al. | | |
| 2020/0348626 A1 | 11/2020 | Yao et al. | | |
| 2022/0182064 A1 | 6/2022 | Li et al. | | |
| 2023/0179215 A1 * | 6/2023 | Janardhanan | .......... | H03L 7/081 341/120 |

OTHER PUBLICATIONS

Wu, W, et al., "A 28-nm 75-fsrms Analog Fractional-N Sampling PLL With a Highly Linear DTC Incorporating Background DTC Gain Calibration and Reference Clock Duty Cycle Correction," IEEE Journal of Solid-State Circuits, vol. 54, No. 5, May 2019, 12 pages.

Elmallah, A., et al., "A 1.6ps peak-INL 5.3ns range two-step digital-to-time converter in 65nm CMOS," 2018 IEEE Custom Integrated Circuits Conference (CICC), Apr. 2018, 4 pages.

* cited by examiner

*Primary Examiner* — Khai Tran
(74) *Attorney, Agent, or Firm* — Edell, Shapiro & Finnan, LLC

(57) ABSTRACT

A multi-segment digital-to-time converter is provided. The digital-to-time converter includes a plurality of delay stages arranged in series, and a plurality of local synchronization logic circuits each configured to control an associated delay stage of the plurality of delay stages. Each local synchronization logic circuit provides a digital-to-time converter code and a reset signal to the associated delay stage synchronized to a local input clock and a local output clock of the associated delay stage.

20 Claims, 14 Drawing Sheets

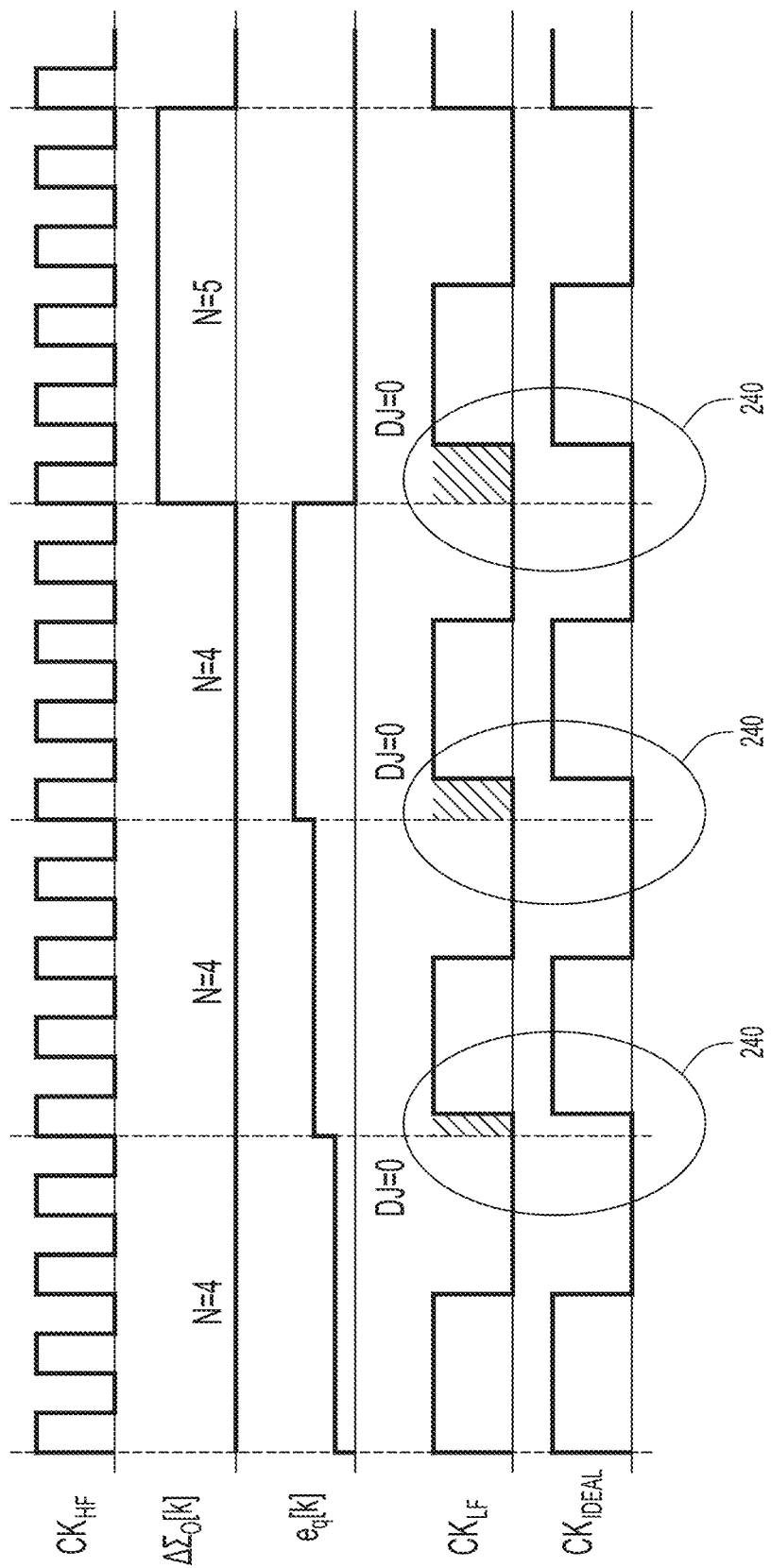

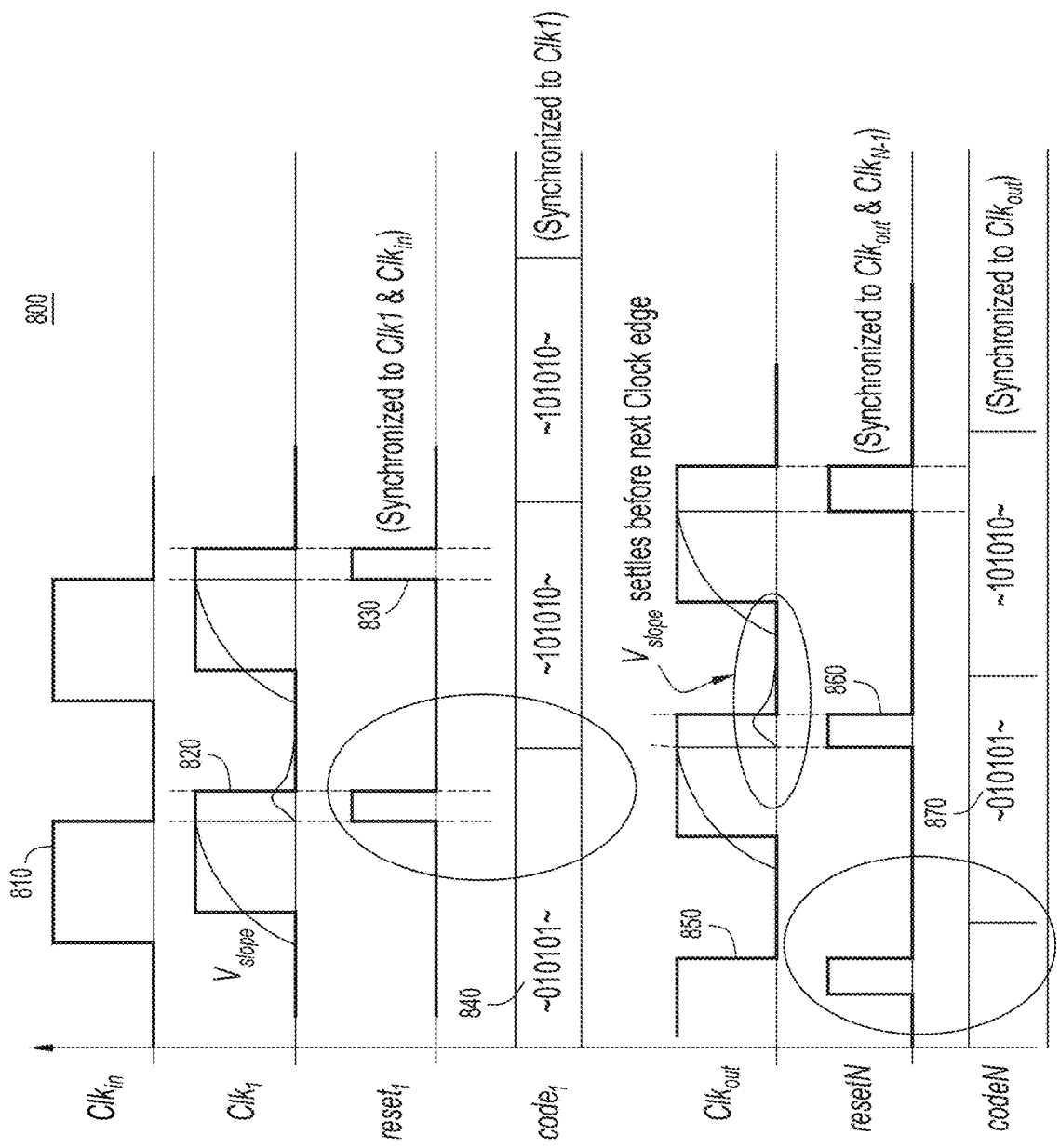

1100

> PROVIDING A PLURALITY OF DELAY STAGES ARRANGED IN SERIES SUCH THAT EACH DELAY STAGE RECEIVES A LOCAL INPUT CLOCK AND BASED ON A DIGITAL-TO-TIME CONVERTER CODE AND A RESET PULSE, GENERATES A LOCAL OUTPUT CLOCK THAT IS SUPPLIED AS INPUT TO A NEXT DELAY STAGE OF THE PLURALITY OF DELAY STAGES ⟶ 1110

> SYNCHRONIZING THE DIGITAL-TO-TIME CONVERTER CODE AND THE RESET PULSE FOR A GIVEN DELAY STAGE TO THE LOCAL OUTPUT CLOCK AND THE LOCAL INPUT CLOCK OF THE GIVEN DELAY STAGE ⟶ 1120

FIG.11

SEGMENTED DIGITAL-TO-TIME CONVERTER

TECHNICAL FIELD

The present disclosure relates to clocking circuitry and methods for communication applications.

BACKGROUND

Fractional-N phase lock loops (PLLs) are used to generate a high frequency output clock from a fixed frequency crystal reference oscillator. A fractional-N PLL generates outputs as a fractional multiple of an input frequency, and is used for high precision (e.g., parts per million (PPM)) frequency error transfer for communication applications with low clock jitter.

BRIEF DESCRIPTION OF THE DRAWINGS

FIG. 2B is a timing diagram of the waveforms associated with the operation of the frequency divider shown in FIG. 2A.

FIG. 8 illustrates a timing diagram for the waveforms associated two stages of the multi-stage digital-to-time converter shown in FIG. 6, according to an example embodiment.

FIG. 11 is a flow chart for a method of performing digital-to-time conversion, according to an example embodiment.

DETAILED DESCRIPTION

Overview

In one embodiment, a multi-segment digital-to-time converter is provided. The digital-to-time converter includes a plurality of delay stages arranged in series, and a plurality of local synchronization logic circuits each configured to control an associated delay stage of the plurality of delay stages. Each local synchronization logic circuit provides a digital-to-time converter code and a reset signal to the associated delay stage synchronized to a local input clock and a local output clock of the associated delay stage.

EXAMPLE EMBODIMENTS

Figure 1:
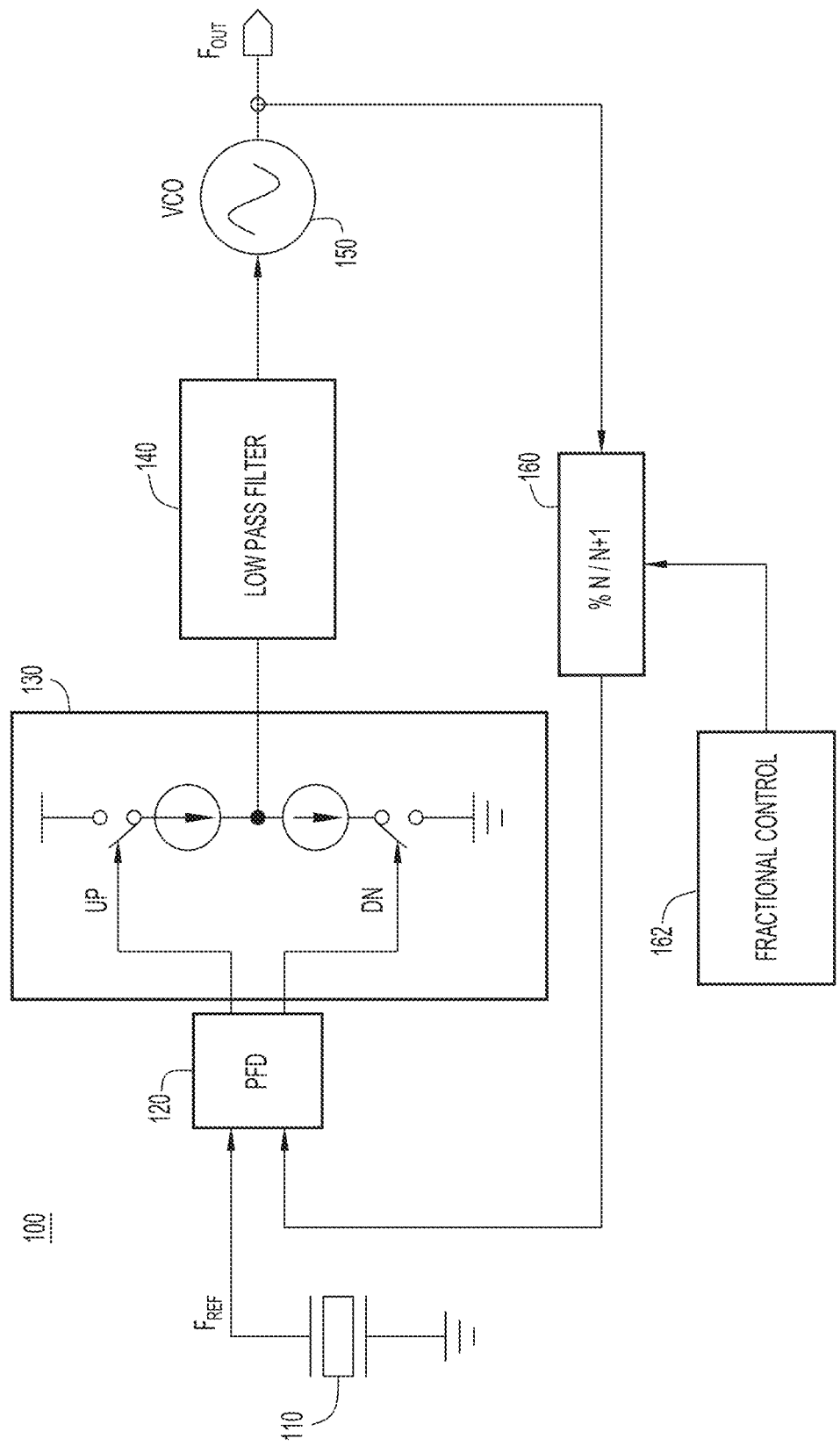
FIG. 1 is block diagram of a fractional-N phase lock loop (PLL) that may employ a digital-to-time converter in a frequency divider, according to an example embodiment.

FIG. 1 shows a fractional-N phase lock loop (PLL) 100 that includes a reference crystal oscillator 110, a phase-frequency detector (PFD) 120, a frequency adjustment circuit 130, a low pass filter 140, a voltage-controlled oscillator (VCO) 150, and a multi-modulus divider (MMD) 160. The MMD 160 receives as input a fractional control 162. The output of the fractional-N PLL 100 is $F_{OUT}=(N+\alpha) \cdot FREF$ To generate fractional output frequencies, the feedback divider or MMD 160 in the fractional-N PLL 100 is dynamically changed on every cycle. For example, to generate a multiplication of 4.25, the divider ratio is set to 4 for 3 cycles and 5 for 1 cycle. On a long-term time average the desired fractional ratio is achieved.

Even though a fractional ratio is achieved with long-term averaging, there is instantaneous frequency error in the output with respect to an ideal fractional output clock. This frequency error can translate into a high deterministic jitter in the output clock. To reduce this jitter, the PLL bandwidth is lowered, but that can result in high oscillator noise contribution to the output. A power-hungry oscillator may be used to address this challenge.

Figure 2A:
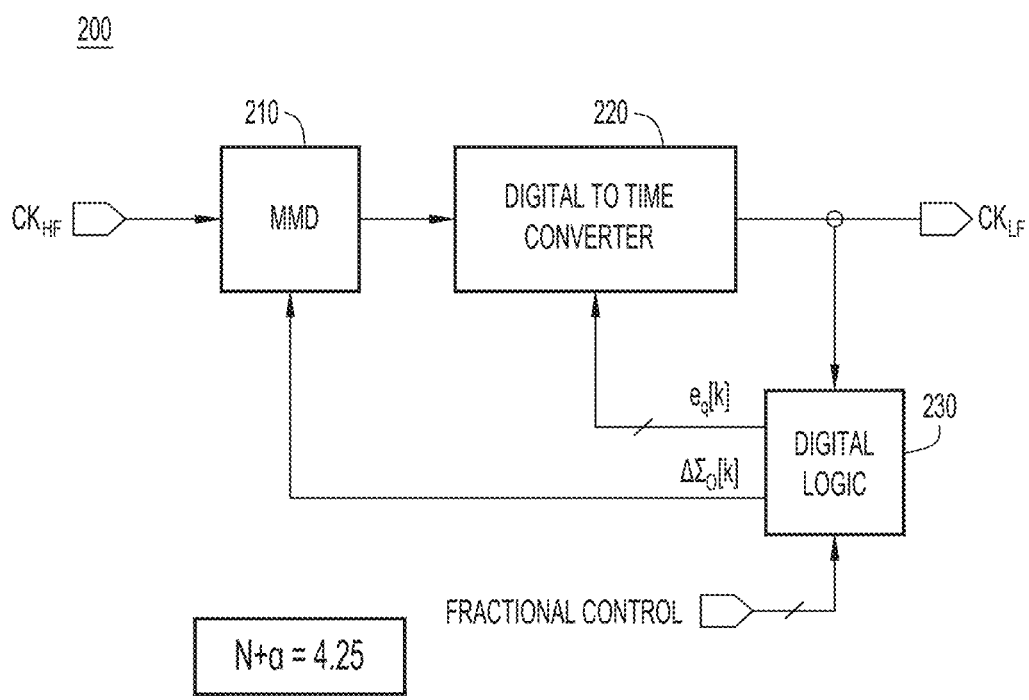
FIG. 2A is a block diagram of a frequency divider that includes a digital-to-time converter, according to an example embodiment.

Fractional clocking performance can be improved by adding a digital-to-time converter (DTC) at the output of the MMD. Reference is now made to FIG. 2A. FIG. 2A shows a frequency divider 200 that includes an MMD 210 (similar to MMD 160 of FIG. 1), a DTC 220 and digital logic 230. The DTC 220 dynamically changes the output clock phase and cancels the deterministic jitter caused by divider quantization, resulting in closer to ideal fractional operation. With the DTC, a fractional-N PLL can behave as an integer-N PLL with a high bandwidth.

FIG. 2B shows the waveforms associated with the operation of the frequency divider 200 of FIG. 2A, for an example where $N+\alpha=4.25$. As shown at 240, performance can be improved when the DTC 220 is used to cancel quantization noise, which in turn improves deterministic jitter (DJ).

A DTC adds time-delay to an input clock based on an input digital control word. Ideally this digital-to-time relationship should be linear, but circuit imperfections make it non-linear. This characteristic is referred to as Integral Non-linearity (INL). Higher INL translates to spurious tones at the output and diminishes the ability to obtain low jitter in a fractional-N PLL. Transistors in the DTC add thermal and flicker noise, which degrades root mean squared (RMS) jitter, also known as phase noise. It is desirable to minimize the INL and RMS jitter of a DTC.

An improved segmented multi-stage DTC is presented herein. This multi-stage DTC has very low INL and jitter performance, making it suitable for fractional-N PLLs. The INL degradation due to systematic skew between the input clock and internal nodes of the multi-stage DTC is solved in the DTC design presented herein. The code and reset control signals for each delay stage or cell of the multi-stage DTC are derived locally using resynchronization flip-flops for each delay stage. The jitter degradation of the clock from transistor noise inside the DTC is overcome using a set of buffers that do not add random jitter to the delayed edge. This DTC architecture causes minimal duty cycle degradation to the clock, and can be quite useful in fractional-N PLLs operating from high reference frequencies, where timing margins for the DTC are stringent.

Figure 3:
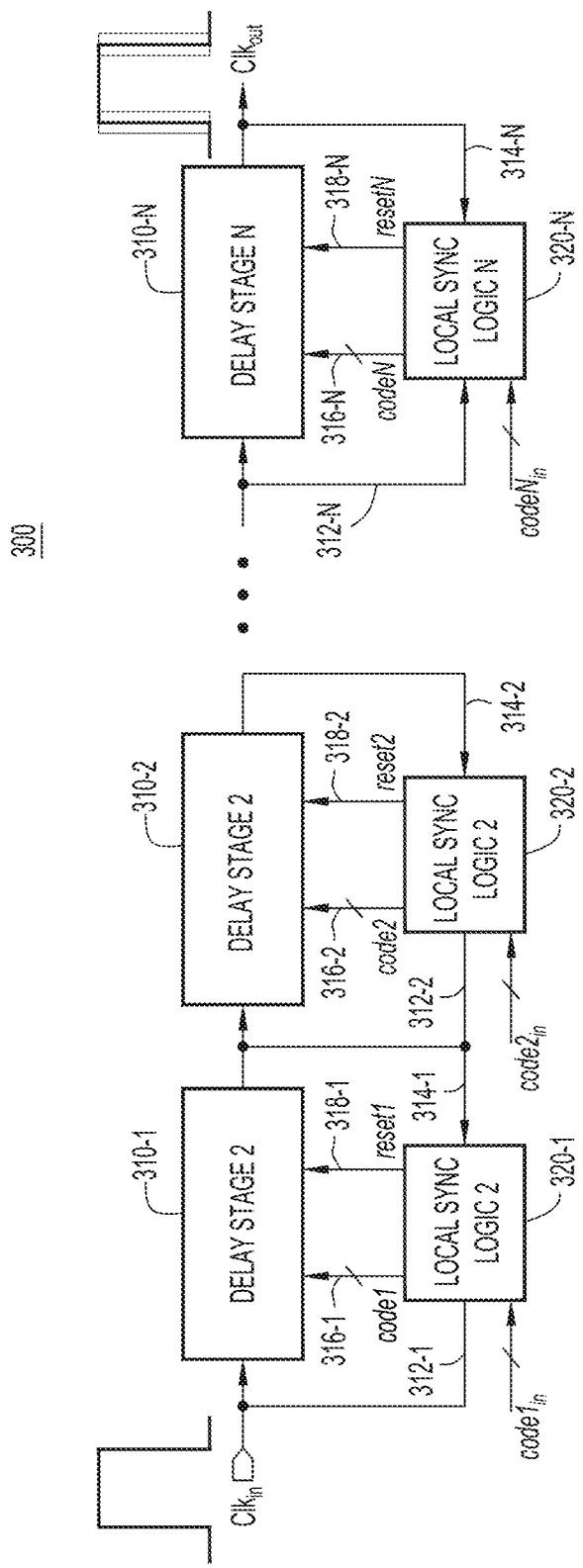
FIG. 3 illustrates a block diagram of a multi-stage digital-to-time converter comprising a plurality of delay stages each of which is controlled by a dedicated local synchronization logic circuit, according to an example embodiment.

Reference is now made to FIG. 3. FIG. 3 illustrates a multi-stage DTC 300 that comprises a plurality of delay stages 310-1, 310-2, ..., 310-N coupled in a cascaded or series configuration. There are local synchronization digital logic circuits 320-1, 320-2, ..., 320-N, each of which controls an associated delay stage of the plurality of delay stages 310-1-310-N. The local synchronization logic circuits 320-1-320-N provide the DTC code and a reset pulse for each associated delay stage 310-1-310-N, synchronized to a local input clock and a local output clock of the associated delay stage. The first delay stage 310-1 of the plurality of delay stages is configured to receive an input clock signal, $Clk_{in}$, and the last delay stage 310-N of the plurality of delay stages is configured to provide an output clock signal, $Clk_{out}$.

The local synchronization logic circuit 320-1 receives as input the local input clock 312-1 for delay stage 310-1, which corresponds to $Clk_{in}$ to the DTC 300, the digital input control word (code $I_{in}$) of the DTC 300, and the local output clock 314-1 of delay stage 310-1, which also is the input clock for the next delay stage 310-2. Using these local clock signals and DTCcode, the local synchronization logic circuit 320-1 generates as output the DTC code, code1 shown at 316-1, and the reset pulse, reset1, shown at 318-1. Similarly, the local synchronization logic circuit 320-2 receives as input the local input clock 312-2 for delay stage 310-2 (which is the same as the local output clock of delay stage 310-1), the digital input control word (code2m) of the DTC 300 and the local output clock 314-2 of delay stage 310-2. Using these local clock signals and digital control word, the local synchronization logic circuit 320-2 generates as output DTC code, code2 shown at 316-2 and the reset pulse, reset2, shown at 318-2. Further still, the local synchronization logic circuit 320-N receives as input the local input clock 312-N for delay stage 310-N (which is the same as the local output clock of delay stage 310-(N−1)) and the local output clock 314-N of delay stage 310-N (which corresponds to $Clk_{out}$ for the DTC 300). Using these local clock signals and digital control word, $codeN_{in}$, the local synchronization logic circuit 320-N generates as output DTC code, codeN, shown at 316-N and the reset pulse, resetN, shown at 318-N.

The details of how the local synchronization logic circuits 320-1-320-N synchronize the DTC input code and reset pulse to the local input clock and local output clock of an associated delay stage are described below in connection with FIG. 7.

Figure 4A:
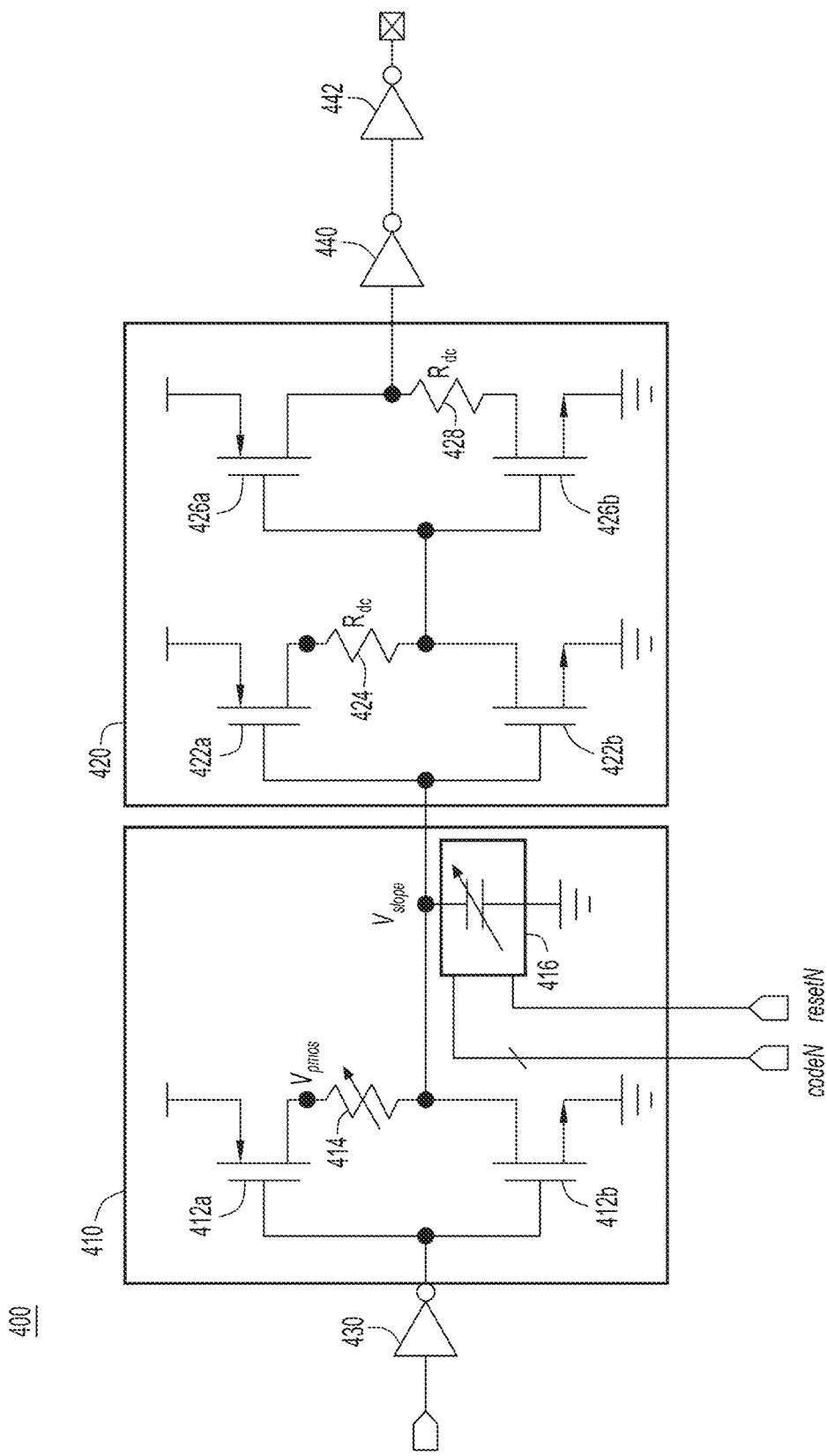
FIG. 4A is a schematic circuit diagram for a delay stage of the plurality of delay stages of the digital-to-time converter of FIG. 3, according to an example embodiment.

Turning now to FIG. 4A, a circuit diagram is shown for a delay stage 400, which is representative of each of the delay stages 310-1-310-N of the DTC 300 shown in FIG. 3. Each delay stage may include a first delay circuit 410 and a second delay circuit 420. The first delay circuit 410 includes P-type metal oxide semiconductor (PMOS) transistor 412a and N-type metal oxide semiconductor (NMOS) transistor 412b and a resistor-capacitor (RC) combination including a variable resistor 414 and a variable capacitor bank 416. The variable resistor 414 is connected between the drain of the PMOS transistor 412a and drain of the NMOS transistor 412b. The variable capacitor bank 416 is connected between the drain of the NMOS transistor 412b and ground. The output of the first delay circuit 410 is taken at the voltage across the variable capacitor bank 416, and this voltage is referred to an internal node voltage $V_{slope}$. The first delay circuit 410 is referred to herein as a driver sub-stage circuit or RC-based delay circuit.

The second delay circuit 420 includes two delay buffers/cells connected in series with each other. A first delay cell (buffer) includes PMOS transistor 422a and NMOS transistor 422b, and a resistor 424 ($R_{DC}$) coupled between the drain of the PMOS transistor 422a and the drain of the NMOS transistor 422b. Similarly, a second delay cell (buffer) includes PMOS transistor 426a and NMOS transistor 426b, and a resistor 428 coupled between the drain of the PMOS transistor 426a and the drain of the NMOS transistor 426b. Both the resistors 424 and 428 can be variable resistors similar to the variable resistor 414 used in first delay circuit 410. The output of the first delay cell in the first delay circuit 420 is taken at the drain of NMOS transistor 422b, and the output of the second delay cell in is taken at the drain of PMOS transistor 426a. The second delay circuit 420 is also referred to as a duty cycle restoration sub-stage circuit as it slows down an unused edge of the local output clock for the associated delay stage so as to minimize jitter added to a delayed edge of the local output clock.

The input to the delay stage 400 may be coupled via an inverter 430 that is in turn coupled to the input of the first delay circuit 410. In addition, the input digital controls codeN and resetN are provided as inputs to the variable capacitor bank 416. The output of the second delay circuit 420 may be coupled to two inverters 440 and 442.

Figure 4B:
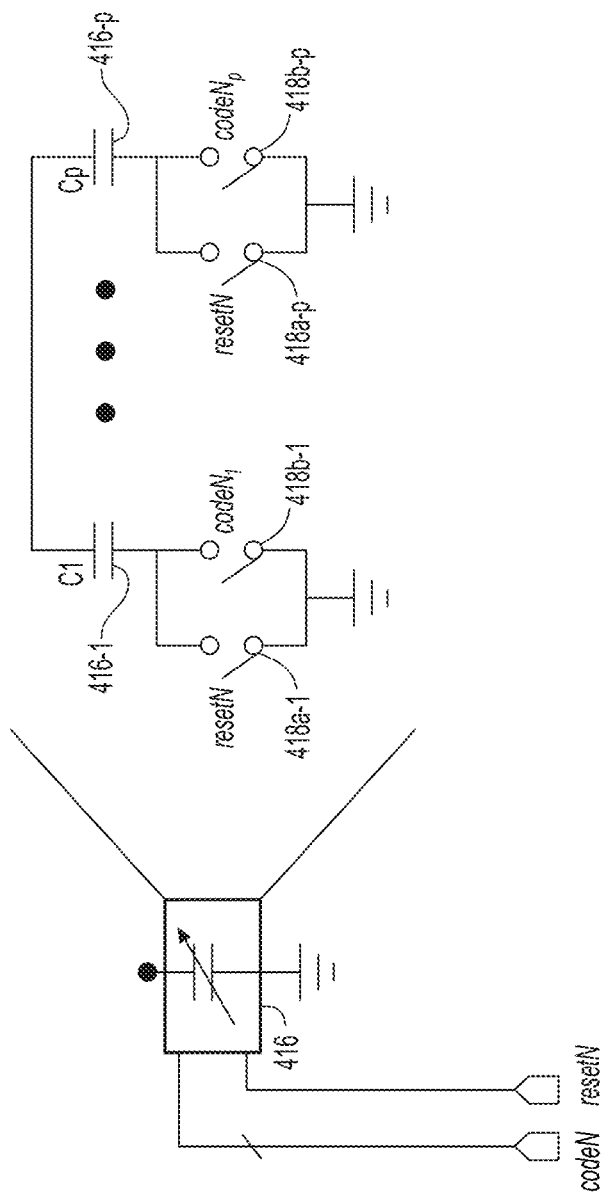
FIG. 4B is a schematic circuit diagram of a variable capacitor bank that forms a part of a first delay circuit of each delay stage shown in FIG. 4A, according to an example embodiment.

CodeNin is the input code for each delay stage generated by a binary-to-thermometer segmented code converter, described further below. The local synchronization logic synchronizes these codes with the respective input/output local clocks of each delay stage and generates the synchronized output code, codeN, for delay stage N. Reference is now made to FIG. 4B. The synchronized output code, codeN, for delay stage N, has p bits, denoted $codeN_1$-$codeN_p$. As a result, the variable capacitor bank 416 has p capacitors, denoted FIG. 4B shows an example of how a variable capacitor bank 416 can be implemented. The digital control signal codeN which is "p" bits wide ($codeN_1$-$codeN_p$), controls the variable capacitor bank 416, which is a p-bit wide capacitor bank comprising capacitors 416-1-416-p. For each capacitor 416-1 to 416-p, there is a pair of switches 418a-1/418b-1 to 418a-p/418b-p connected in parallel with each other. The resetN control signal controls switch 418a-1 to 418-p, which is connected in parallel to the switch 418b-1 to 418b-p, respectively, controlled by $codeN_1$ to $codeN_p$, respectively. The parallel combination of these switches is connected in series with the associated capacitor of the variable capacitor bank 416. Based on the control signal codeN, the total capacitance of the variable capacitor bank 416 changes, thereby changing the delay of the delay stage 400. Said another way, the variable capacitor bank 416 comprises a plurality of capacitors coupled in parallel and a pair of switches connected in series between ground and a respective capacitor of the plurality of capacitors. The digital-to-time code to a given delay stage, codeN, comprises a digital code having a bit-width that corresponds to the number of the plurality of capacitors of the variable capacitor bank 416. Each bit of the digital code codeN is provided as a control to a corresponding switch (418*b*-1 to 418*b*-*p*) in the pair of switches for the plurality of capacitors to selectively connect an associated capacitor of the plurality of capacitors so as to control a total capacitance of the bank of the plurality of capacitors. Likewise, the reset signal, resetN, for a given delay stage is provided as a control to a corresponding switch (the other corresponding switch, 418*a*-1 to 418*a*-*p*) in the pair of switches for the plurality of capacitors to control the timing, synchronized to local clock signals for the given delay stage, of the capacitor selection made by the digital code, codeN.

Figure 5A:
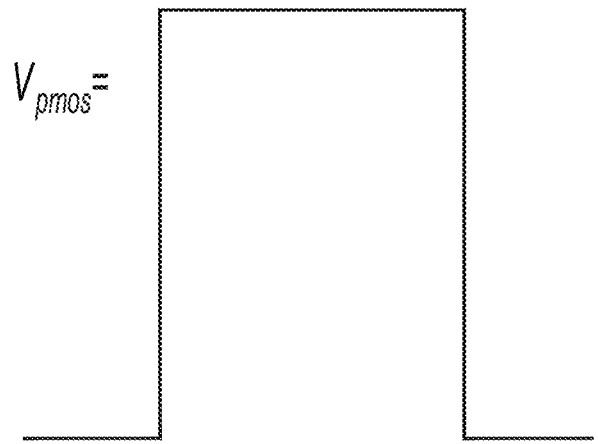
FIGS. 5A and 5B illustrate voltage waveforms internal to a first delay circuit of a delay stage of the multi-stage digital-to-time converter of FIG. 3, according to an example embodiment.

Referring to FIG. 5A, the first delay circuit 410 achieves a faster rise and fall at the drain of PMOS transistor 412*a*, as denoted by the voltage waveform for $V_{pmos}$. Faster rise and fall times exhibits greater immunity to flicker and thermal noise from the PMOS transistor 412*a*.

Figure 5B:
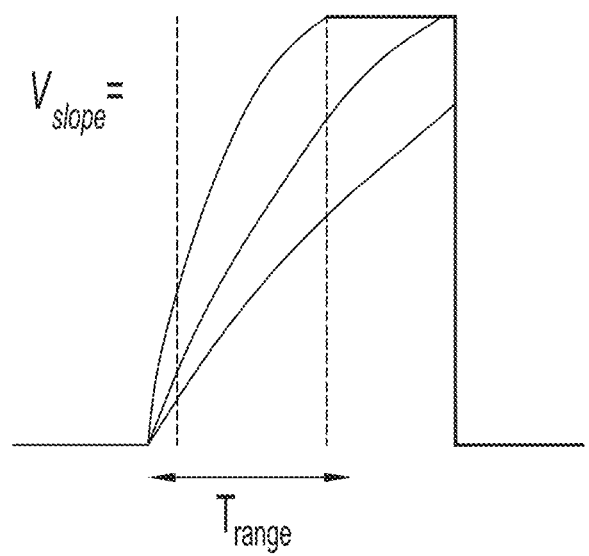

FIG. 5B shows the waveform for $V_{slope}$, shown in FIG. 4A. The variable resistor 414 and variable capacitor bank 416 provide an adjustable RC-based delay, providing a time delay range of $T_{range}$ across process, voltage, and temperature (PVT as depicted by the waveform of FIG. 5B, but at the expense of duty cycle of the delayed clock waveform. However, the second delay circuit 420 accounts for the potential impact on duty cycle, and restores the duty cycle by slowing down the unused edge of the local output clock (which is the falling edge of Vslope waveform in this example) for the associated delay stage. This minimizes jitter added to a delayed edge (which is rising edge in this example) of the local output clock.

Figure 6:
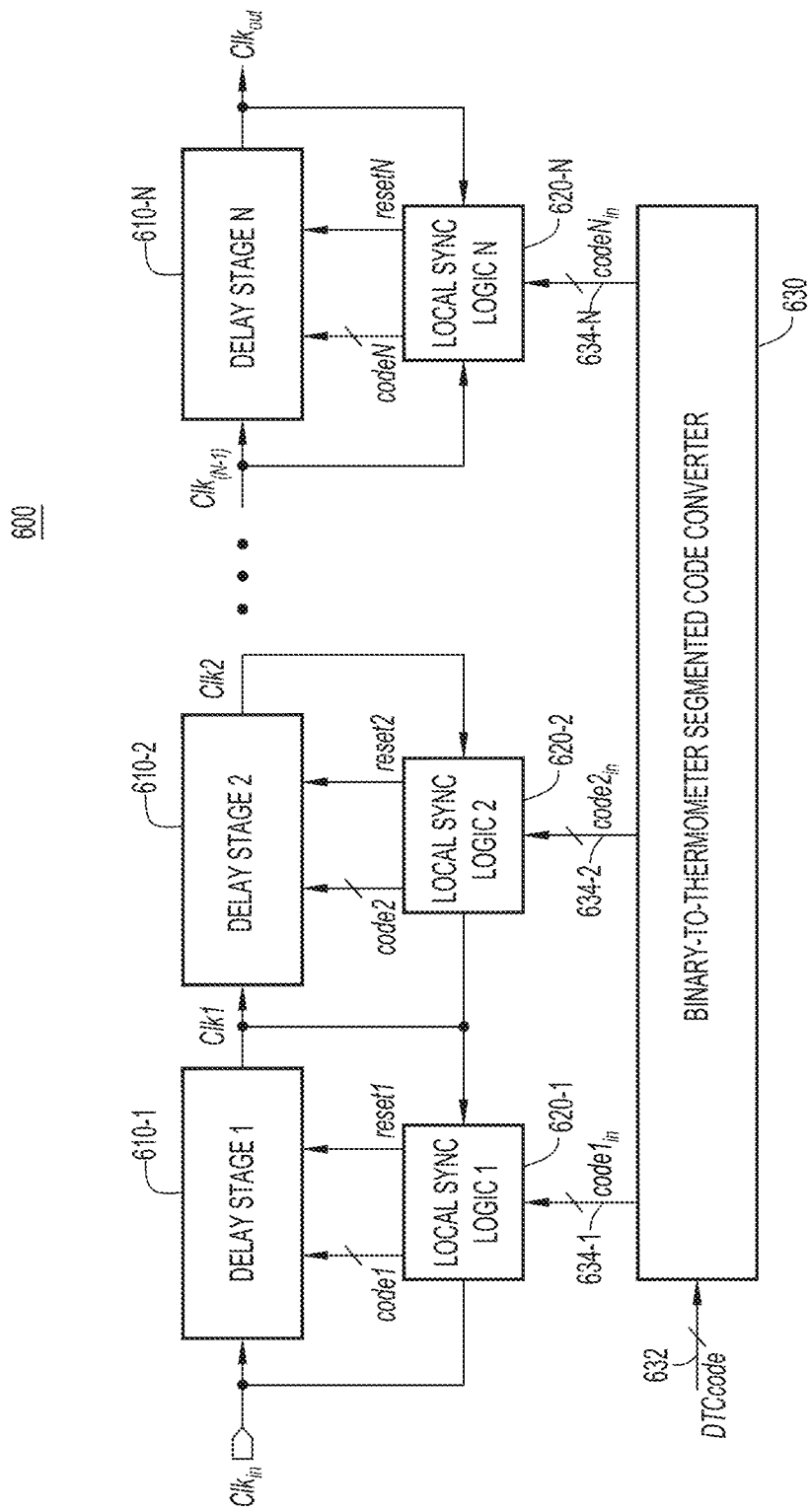
FIG. 6 is a block diagram of a multi-stage digital-to-time converter, similar to FIG. 3, and further including a binary-to-thermometer segmented code converter, according to an example embodiment.

Reference is now made to FIG. 6. FIG. 6 shows a diagram of a multi-stage DTC 600 that is similar to the multi-stage DTC shown in FIG. 3, but further including digital logic for a binary-to-thermometer segmented code converter. Thus, the multi-stage DTC 600 includes a plurality of delay stages 610-1, 610-2, ..., 610-N, a corresponding plurality of local synchronization logic circuits 620-1, 620-2, ..., 620-N, and a binary-to-thermometer segmented code converter 630. The binary-to-thermometer segmented code converter 630 outputs a DTC code segment (for each of the plurality of delay stages 610-1-610-N) to a corresponding local synchronization logic circuit 620-1-620-N for the plurality of delay stages 610-1-610-N. More specifically, the binary-to-thermometer segmented code converter 630 receives as input a digital control word DTCcode 632 and outputs a plurality of DTC code segments 634-1, 634-2, ..., 634-N, supplied as input to the local synchronization logic circuits 620-1, 620-2, ..., 620-N, respectively.

Prior multi-segmented DTC designs generate a digital code for each delay stage and a reset signal/pulse is synchronized to a global clock, the last stage output clock—$Clk_{out}$. The reset signal/pulse assists in setting initial conditions for the capacitor of each the delay stage (variable capacitor bank 416 in FIG. 4A). For large delay ranges, the number of delay stages needs to be increased, and that can affect linearity of the DTC. The total delay is in the order of the input clock period. With higher input clock frequencies, the timing margin for the reset pulse and the DTC code (for each delay stage) becomes stringent. Partial settling inside a preceding delay stages after reset leads to INL performance degradation.

To overcome this problem, the reset signal/pulse and DTC code for each delay stage are not controlled by a global clock. Instead, the local synchronization logic circuits 620-1-620-N synchronize the reset signal/pulse and the DTC code for each delay stage with its respective local input and local output clocks.

Figure 7:
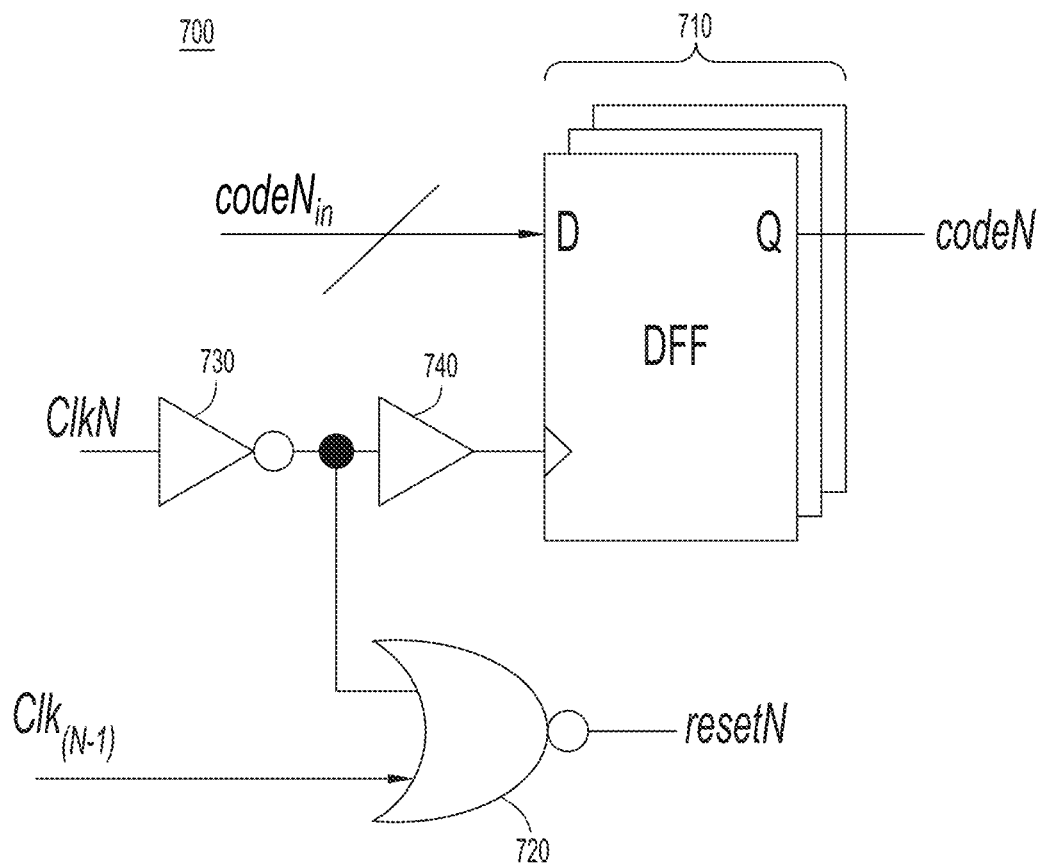
FIG. 7 illustrates a circuit diagram of the local synchronization logic circuit used in the digital-to-time converter shown in FIGS. 3 and 6, according to an example embodiment.

Reference is now made to FIG. 7, which shows an example circuit diagram of a local synchronization logic circuit 700 for a given delay stage N. The diagram of FIG. 7 is representative of the local synchronization logic circuits 620-1-620-N shown in FIG. 6. Each local synchronization logic circuit includes a bank of D-type flip-flops (DFF) 710 (equal in number to the width of the DTC code for stage N, denoted codeN), a NOR gate 720, an inverter 730 and a buffer 740. The bank of D-type flip-flops 710 are also referred to as resynchronization flip-flops.

The inputs to the local synchronization logic circuit 700 are the local input clock for the present stage, denoted $Clk_{(N-1)}$, the local output clock for the current stage N, ClkN, and the segmented DTC code for the delay stage N that is output by the binary-to-thermometer segmented code converter 630 (FIG. 6), denoted $codeN_{in}$. The outputs of the local synchronization logic circuit 700 are the reset signal/pulse for stage N, denoted resetN, and the DTC code for stage N, denoted codeN. As shown in FIG. 7, the bank of D-type flip-flops 710 outputs codeN and is synchronized to/clocked by a clock signal derived from the local output clock for stage N, ClkN, via inverter 730 and buffer 740. Similarly, the NOR gate 720 receives at a first input the local input clock for stage N ($Clk_{(N-1)}$) and at a second input the inverse of the local output clock for stage N, and generates as output the reset signal/pulse resetN. Thus, the reset signal/pulse resetN is synchronized to the local input clock and to (an inverse of) the local output clock for a given stage.

FIG. 8 illustrates a timing diagram 800 for the waveforms associated with stage 1 and stage N of the multi-stage DTC 600 shown in FIG. 6, as an example. FIG. 8 shows, for stage 1, the waveform 810 for local input clock for stage 1, which corresponds to the input clock to the multi-stage DTC 600, $Clk_{in}$; the waveform 820 for the local output clock for stage 1, Clk1; the waveform 830 for the reset pulse for stage 1, reset1, and the timing of the DTC code 840 for stage 1, code1. As shown in FIG. 8, and explained above in connection with FIG. 7, the reset pulse reset1, is synchronized to the local output clock Clk1 and the local input clock $Clk_{in}$ for stage 1, and the DTC code for stage 1 is synchronized to the local output clock Clk1. A similar relationship exists for $Clk_{out}$ and resetN for stage N as shown by waveforms 850 and 860 and timing of DTC code 870 for stage N.

The benefits of this arrangement are now described with reference to FIG. 8. The relative timing between reset, code and $V_{slope}$ is the same for all of the delay stages. The internal node voltage $V_{slope}$ has enough time to settle after reset and before the next rising edge, regardless of the DTC code. There is no DTC code dependent non-linearity, which translates into good INL performance.

Figure 9A:
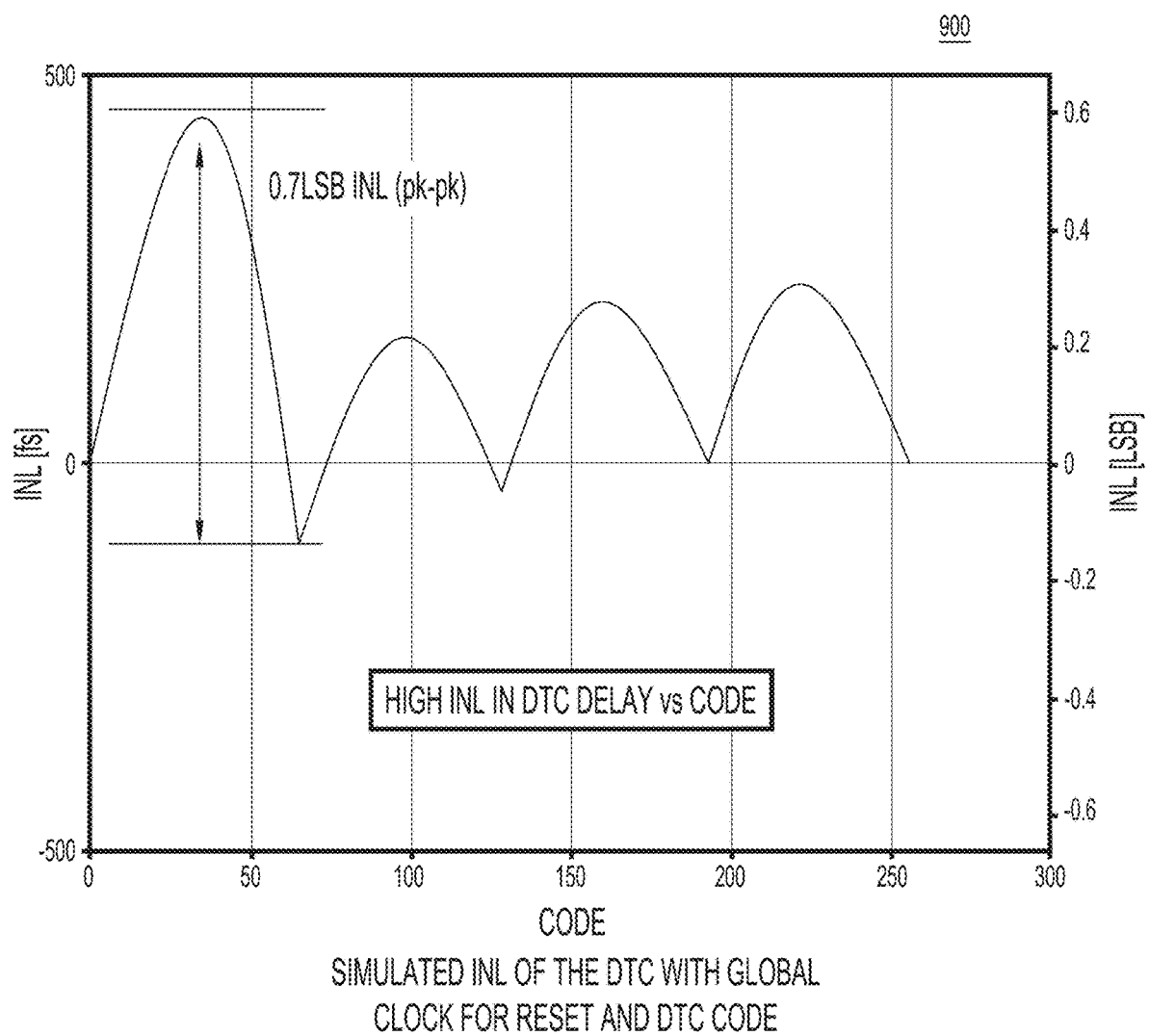
FIGS. 9A and 9B illustrate plots comparing simulation results for Integral Non-Linearity (INL) performance of a digital-to-time converter with global synchronization and of a digital-to-time converter with local synchronization, according to an example embodiment.
Figure 9B:
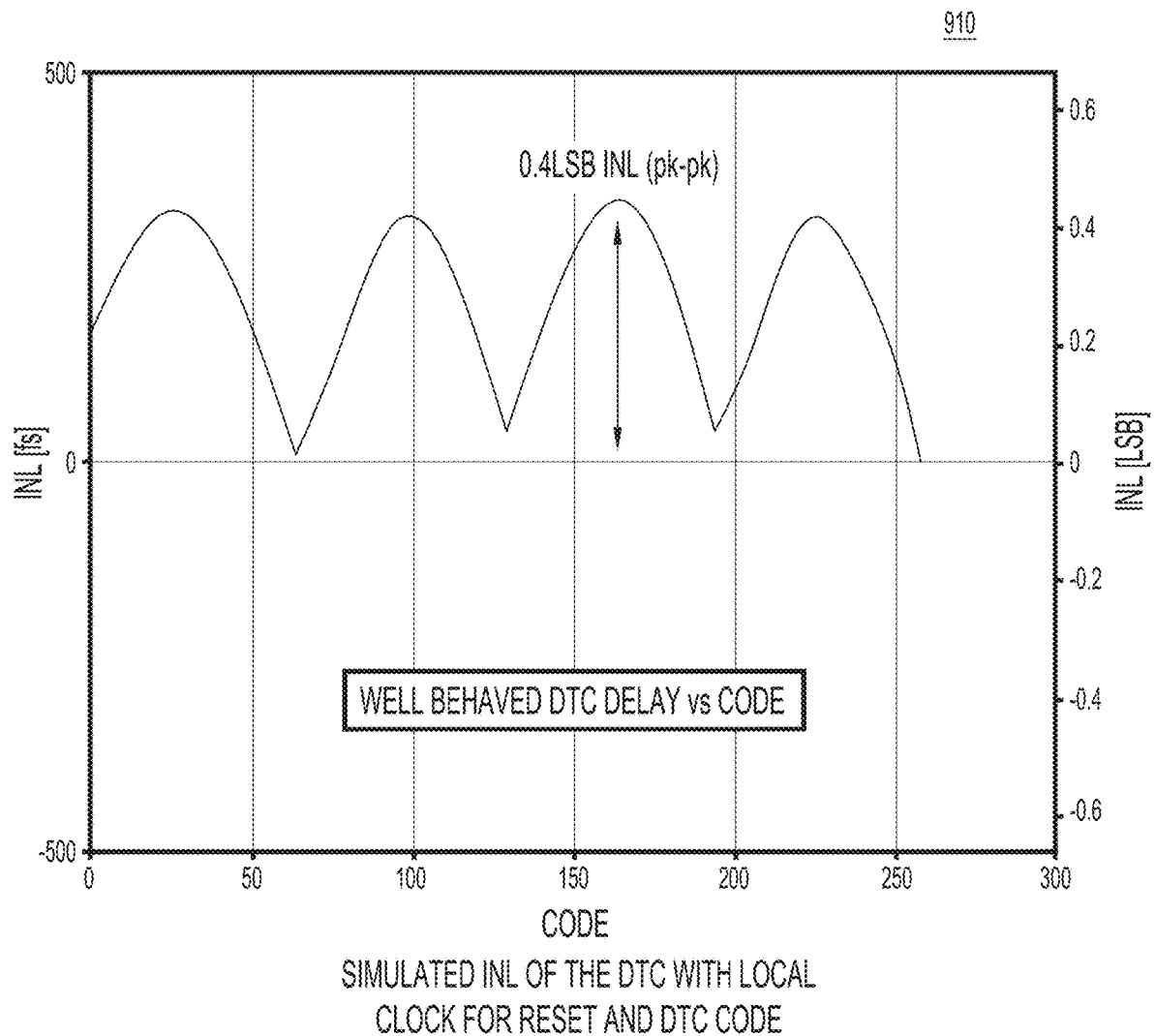

Reference is now made to FIGS. 9A and 9B. These figures show a comparison of simulation results for a 4-stage DTC, with a 600 MHz reference clock. FIG. 9A shows a plot 900 of simulated INL of the DTC that uses a global clock for the reset pulse and the DTC code for the delay stages. FIG. 9B shows a plot 910 of the simulated INL of the DTC that uses a local clock for reset and the DTC for each of the delay stages, as used by the multi-stage DTCs shown in FIGS. 3 and 6. The plot 900 in FIG. 9A shows that there is a high INL in the DTC delay versus code. By contrast, FIG. 9B shows a well behaved DTC delay versus code relationship. These figures illustrate that local synchronization of the delay stages can achieve reduced non-linearity of the DTC.

Figure 10:
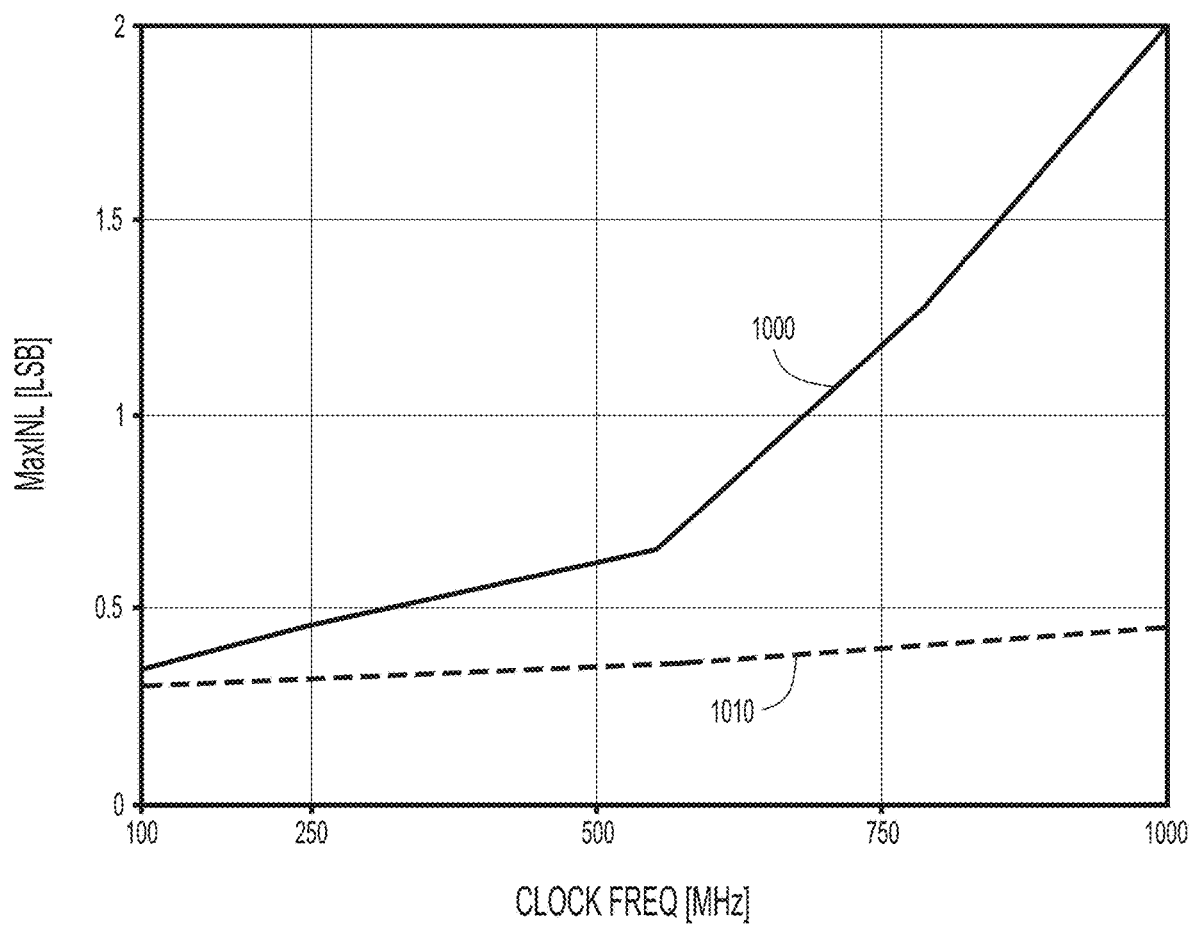
FIG. 10 illustrates plots comparing performance of a digital-to-time converter with global synchronization and a digital-to-time converter with local synchronization at higher reference clock frequencies, according to an example embodiment.

FIG. 10 illustrates plots comparing performance of a DTC with global synchronization and a DTC with local synchronization. Plot 1000 is for a DTC with global synchronization and plot 1010 is for a DTC with local synchronization. For a DTC with global synchronization, the INL degrades considerably with input clock frequency due to large glitches and improper settling of the internal nodes, especially the $V_{slope}$ node. By contrast, the DTC of the embodiments presented herein, with the RC-delay in the first delay circuit and duty cycle reduction characteristics of the second delay circuit (having the two buffer delays) of the delay stages results in the output waveform that stretches the unused edge of the output clock without adding any additional jitter to the delayed edge. The local synchronization logic greatly improves the performance of the DTC at higher input clock frequencies.

FIG. 11 illustrates a flow chart for a method 1100 of performing digital-to-time conversion, according to an example embodiment. The method 1100 includes, at step 1110, providing a plurality of delay stages arranged in series such that each delay stage receives a local input clock and based on a digital-to-time converter code and a reset pulse, generates a local output clock that is supplied as input to a next delay stage of the plurality of delay stages. Next, at step 1120, the method 1100 includes synchronizing the digital-to-time converter code and the reset pulse for a given delay stage to the local output clock and the local input clock of the given delay stage.

In summary, the multi-stage RC delay-based DTC presented herein exhibits superior linearity and noise performance over conventional architectures. The INL degradation due to systematic skew between the input clock and internal nodes of the multi-stage DTC is overcome by the techniques presented herein. With the local reset and DTC code synchronization logic, the INL degradation at high reference frequencies is reduced. The jitter and duty cycle degradation of the clock from transistor noise inside the DTC is solved using a set of buffers (in the second delay circuit of the delay stage) that do not add random jitter to the delayed edge. The DTC design presented herein causes minimal duty cycle degradation to the clock, and can significantly benefit fractional-N PLLs operating from high reference frequencies, where timing margins for the DTC may be stringent.

In some aspects, the techniques described herein relate to a digital-to-time converter including: a plurality of delay stages arranged in series, wherein a first delay stage of the plurality of delay stages is configured to receive an input clock signal and a last delay stage of the plurality of delay stages is configured to provide an output clock signal; and a plurality of local synchronization logic circuits each configured to control an associated delay stage of the plurality of delay stages, wherein each local synchronization logic circuit provides a digital-to-time converter code and a reset signal to the associated delay stage synchronized to a local input clock and a local output clock of the associated delay stage.

In some aspects, each delay stage includes a first delay circuit and a second delay circuit, wherein an output of the first delay circuit is coupled to an input of the second delay circuit.

In some aspects, the first delay circuit includes a variable resistor and variable capacitor coupled between an output and ground, wherein a voltage across the variable capacitor corresponds to the output of the first delay circuit that is coupled to the input of the second delay circuit.

In some aspects, the variable capacitor includes a bank of a plurality of capacitors coupled in parallel and a pair of switches connected in series between ground and a respective capacitor of the plurality of capacitors, and wherein the digital-to-time converter code includes a digital code having a bit-width that corresponds to a number of the plurality of capacitors, each bit of the digital code being provided as a control to a corresponding switch in the pair of switches for the plurality of capacitors to selectively connect an associated capacitor of the plurality of capacitors so as to control a total capacitance of the bank of the plurality of capacitors.

In some aspects, the second delay circuit includes first and second delay cells connected in series with each other, wherein the second delay circuit is configured to slow an unused edge of the local output clock of the associated delay stage so as to minimize jitter added to a delayed edge of the local output clock.

In some aspects, each local synchronization logic circuit includes a bank of D-type flip flops and digital logic, wherein the bank of D-type flip-flops receives as input a segmented DTC code and outputs a DTC code for the associated delay stage, and the bank of D-type flip-flops is clocked based on the local output clock of the associated delay stage, and the digital logic is configured to receive as inputs the local input clock for the associated delay stage and a signal derived from the local output clock and to generate the reset signal for the associated delay stage.

In some aspects, the digital logic of each local synchronization logic circuit includes a NOR gate having a first input and a second input, the first input coupled to receive an inverse of the local output clock and the second input coupled to receive the local input clock.

In some aspects, the techniques described herein relate to a digital-to-time converter, further including a binary-to-thermometer segmented code converter configured to receive as input a binary digital-to-time converter code and to generate a plurality of segmented digital-to-time converter codes for the plurality of delay stages and provides each segmented digital-to-time code of the plurality of segmented digital-to-time converter codes as input to the local synchronization logic circuit for the associated delay stage.

In some aspects, the techniques described herein relate to a fractional-N phase lock loop (PLL) including a multi-modulus divider that includes the digital-to-time converter.

In some aspects, the techniques described herein relate to a digital-to-time converter including: a plurality of delay stages connected in series, wherein a first delay stage of the plurality of delay stages is configured to receive an input clock signal and a last delay stage of the plurality of delay stages is configured to provide an output clock signal, each delay stage including a first delay circuit and a second delay circuit, wherein an output of the first delay circuit is coupled to an input of the second delay circuit; and a plurality of local synchronization logic circuits each configured to control an associated delay stage of the plurality of delay stages, wherein each local synchronization logic circuit provides a digital-to-time converter code and a reset signal to the associated delay stage synchronized to a local input clock and a local output clock of the associated delay stage; wherein the first delay circuit of the associated delay stage is configured to impose a variable delay based on the digital-to-time converter code provided to the associated delay stage.

In some aspects, the first delay circuit includes a variable resistor and variable capacitor coupled between an output and ground, wherein a voltage across the variable capacitor corresponds to the output of the first delay circuit that is coupled to the input of the second delay circuit.

In some aspects, the variable capacitor includes a bank of a plurality of capacitors coupled in parallel and a pair of switches connected in series between ground and a respective capacitor of the plurality of capacitors, and wherein the digital-to-time converter code includes a digital code having a bit-width that corresponds to a number of the plurality of capacitors, each bit of the digital code being provided as a control to a corresponding switch in the pair of switches for the plurality of capacitors to selectively connect an associated capacitor of the plurality of capacitors so as to control a total capacitance of the bank of the plurality of capacitors.

In some aspects, the second delay circuit includes first and second delay cells connected in series with each other, wherein the second delay circuit is configured to slow an unused edge of the local output clock of the associated delay stage so as to minimize jitter added to a delayed edge of the local output clock.

In some aspects, the techniques described herein relate to a method including: providing a plurality of delay stages arranged in series such that each delay stage receives a local input clock and based on a digital-to-time converter code and a reset pulse, generates a local output clock that is supplied as input to a next delay stage of the plurality of delay stages, wherein a first delay stage of the plurality of delay stages is configured to receive an input clock signal and a last delay stage of the plurality of delay stages is configured to provide an output clock signal; and synchronizing the digital-to-time converter code and the reset pulse for a given delay stage to the local output clock and the local input clock of the given delay stage.

In some aspects, the techniques described herein relate to a method, wherein each delay stage includes a first delay circuit and a second delay circuit, wherein an output of the first delay circuit is coupled to an input of the second delay circuit.

In some aspects, the techniques described herein relate to a method, wherein the first delay circuit includes a variable resistor and variable capacitor coupled between an output and ground, wherein a voltage across the variable capacitor corresponds to the output of the first delay circuit that is coupled to the input of the second delay circuit.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A digital-to-time converter comprising:
a plurality of delay stages arranged in series, wherein a first delay stage of the plurality of delay stages is configured to receive an input clock signal and a last delay stage of the plurality of delay stages is configured to provide an output clock signal; and
a plurality of local synchronization logic circuits each configured to control an associated delay stage of the plurality of delay stages, wherein each local synchronization logic circuit provides a digital-to-time converter code and a reset signal to the associated delay stage synchronized to a local input clock and a local output clock of the associated delay stage.

2. The digital-to-time converter of claim 1, wherein each delay stage comprises a first delay circuit and a second delay circuit, wherein an output of the first delay circuit is coupled to an input of the second delay circuit.

3. The digital-to-time converter of claim 2, wherein the first delay circuit includes a variable resistor and variable capacitor coupled between an output and ground, wherein a voltage across the variable capacitor corresponds to the output of the first delay circuit that is coupled to the input of the second delay circuit.

4. The digital-to-time converter of claim 3, wherein the variable capacitor comprises a bank of a plurality of capacitors coupled in parallel and a pair of switches connected in series between ground and a respective capacitor of the plurality of capacitors, and wherein the digital-to-time converter code comprises a digital code having a bit-width that corresponds to a number of the plurality of capacitors, each bit of the digital code being provided as a control to a corresponding switch in the pair of switches for the plurality of capacitors to selectively connect an associated capacitor of the plurality of capacitors so as to control a total capacitance of the bank of the plurality of capacitors.

5. The digital-to-time converter of claim 3, wherein the second delay circuit includes first and second delay cells connected in series with each other, wherein the second delay circuit is configured to slow an unused edge of the local output clock of the associated delay stage so as to minimize jitter added to a delayed edge of the local output clock.

6. The digital-to-time converter of claim 1, wherein each local synchronization logic circuit includes a bank of D-type flip flops and digital logic, wherein the bank of D-type flip-flops receives as input a segmented DTC code and outputs a DTC code for the associated delay stage, and the bank of D-type flip-flops is clocked based on the local output clock of the associated delay stage, and the digital logic is configured to receive as inputs the local input clock for the associated delay stage and a signal derived from the local output clock and to generate the reset signal for the associated delay stage.

7. The digital-to-time converter of claim 6, wherein the digital logic of each local synchronization logic circuit comprises a NOR gate having a first input and a second input, the first input coupled to receive an inverse of the local output clock and the second input coupled to receive the local input clock.

8. The digital-to-time converter of claim 1, further comprising a binary-to-thermometer segmented code converter configured to receive as input a binary digital-to-time converter code, to generate a plurality of segmented digital-to-time converter codes for the plurality of delay stages and to provide each segmented digital-to-time code of the plurality of segmented digital-to-time converter codes as input to each local synchronization logic circuit for the associated delay stage.

9. A fractional-N phase lock loop (PLL) comprising a multi-modulus divider that includes the digital-to-time converter of claim 1.

10. A digital-to-time converter comprising:
a plurality of delay stages connected in series, wherein a first delay stage of the plurality of delay stages is configured to receive an input clock signal and a last delay stage of the plurality of delay stages is configured to provide an output clock signal , each delay stage comprising a first delay circuit and a second delay circuit, wherein an output of the first delay circuit is coupled to an input of the second delay circuit; and
a plurality of local synchronization logic circuits each configured to control an associated delay stage of the plurality of delay stages, wherein each local synchronization logic circuit provides a digital-to-time converter code and a reset signal to the associated delay stage synchronized to a local input clock and a local output clock of the associated delay stage;
wherein the first delay circuit of the associated delay stage is configured to impose a variable delay based on the digital-to-time converter code provided to the associated delay stage.

11. The digital-to-time converter of claim 10, wherein the first delay circuit includes a variable resistor and variable capacitor coupled between an output and ground, wherein a voltage across the variable capacitor corresponds to the output of the first delay circuit that is coupled to the input of the second delay circuit.

12. The digital-to-time converter of claim 11, wherein the variable capacitor comprises a bank of a plurality of capacitors coupled in parallel and a pair of switches connected in series between ground and a respective capacitor of the plurality of capacitors, and wherein the digital-to-time converter code comprises a digital code having a bit-width that corresponds to a number of the plurality of capacitors, each bit of the digital code being provided as a control to a corresponding switch in the pair of switches for the plurality of capacitors to selectively connect an associated capacitor of the plurality of capacitors so as to control a total capacitance of the bank of the plurality of capacitors.

13. The digital-to-time converter of claim 10, wherein the second delay circuit includes first and second delay cells connected in series with each other, wherein the second delay circuit is configured to slow an unused edge of the local output clock of the associated delay stage so as to minimize jitter added to a delayed edge of the local output clock.

14. The digital-to-time converter of claim 10, wherein each local synchronization logic circuit includes a bank of D-type flip flops and digital logic, wherein the bank of D-type flip-flops receives as input a segmented DTC code and outputs a DTC code for the associated delay stage, and the bank of D-type flip-flops is clocked based on the local output clock of the associated delay stage, and the digital logic is configured to receive as inputs the local input clock for the associated delay stage and a signal derived from the local output clock and to generate the reset signal for the associated delay stage.

15. The digital-to-time converter of claim 14, wherein the digital logic of each local synchronization logic circuit comprises a NOR gate having a first input and a second input, the first input coupled to receive an inverse of the local output clock and the second input coupled to receive the local input clock.

16. The digital-to-time converter of claim 10, further comprising a binary-to-thermometer segmented code converter configured to receive as input a binary digital- to-time converter code, to generate a plurality of segmented digital-to-time converter codes for the plurality of delay stages and to provide each segmented digital-to-time code of the plurality of segmented digital-to-time converter codes as input to each local synchronization logic circuit for the associated delay stage.

17. A fractional-N phase lock loop (PLL) comprising a multi-modulus divider that includes the digital-to-time converter of claim 10.

18. A method comprising:
providing a plurality of delay stages arranged in series such that each delay stage receives a local input clock and based on a digital-to-time converter code and a reset pulse, generates a local output clock that is supplied as input to a next delay stage of the plurality of delay stages, wherein a first delay stage of the plurality of delay stages is configured to receive an input clock signal and a last delay stage of the plurality of delay stages is configured to provide an output clock signal; and synchronizing the digital-to-time converter code and the reset pulse for a given delay stage to the local output clock and the local input clock of the given delay stage.

19. The method of claim 18, wherein each delay stage comprises a first delay circuit and a second delay circuit, wherein an output of the first delay circuit is coupled to an input of the second delay circuit.

20. The method of claim 19, wherein the first delay circuit includes a variable resistor and variable capacitor coupled between an output and ground, wherein a voltage across the variable capacitor corresponds to the output of the first delay circuit that is coupled to the input of the second delay circuit.

* * * * *